(12) United States Patent
Halamoda et al.

(10) Patent No.: US 7,121,178 B2
(45) Date of Patent: Oct. 17, 2006

(54) PUNCHING TOOL WITH RE-USABLE, NEUTRAL STRUCTURAL GROUPS

(75) Inventors: Hans Joachim Halamoda, Albstadt (DE); Siegfried Beerhalter, Schwäbisch Gmünd (DE); Ernst Heinemann, Renquishausen (DE)

(73) Assignee: Groz-Beckert KG, Albstadt (DE)

( * ) Notice: Subject to any disclaimer, the term of this patent is extended or adjusted under 35 U.S.C. 154(b) by 0 days.

(21) Appl. No.: 10/753,960

(22) Filed: Jan. 9, 2004

(65) Prior Publication Data
US 2004/0163519 A1 Aug. 26, 2004

(30) Foreign Application Priority Data
Jan. 10, 2003 (DE) ................. 103 00 818

(51) Int. Cl.
*B26F 1/02* (2006.01)
(52) U.S. Cl. ............... 83/164; 83/451; 83/687; 83/939.1
(58) Field of Classification Search ............... 83/929.1, 83/687, 691, 451, 164, 100, 98, 99
See application file for complete search history.

(56) References Cited
U.S. PATENT DOCUMENTS

| 2,364,011 A | * | 11/1944 | Wales | 83/140 |
| 2,364,994 A | * | 12/1944 | Moore | 256/10 |
| 3,797,342 A | * | 3/1974 | Sekel | 83/55 |
| 3,800,643 A | * | 4/1974 | Scott et al. | 83/100 |
| 4,277,994 A | * | 7/1981 | Gargrave | 83/133 |
| 5,303,618 A | * | 4/1994 | Norell | 76/107.1 |
| 5,836,226 A | * | 11/1998 | Tsuji et al. | 83/129 |
| 6,223,636 B1 | * | 5/2001 | LaPlante et al. | 83/13 |
| 6,463,831 B1 | * | 10/2002 | DiMaria | 76/107.1 |
| 6,679,146 B1 | * | 1/2004 | Balz et al. | 83/619 |

FOREIGN PATENT DOCUMENTS

| DE | 197 51 238 A1 | 5/1999 |
| EP | 0354 152 B1 | 10/1994 |
| JP | 6-320499 | * 11/1994 |
| JP | 06320496 | * 11/1994 |

* cited by examiner

*Primary Examiner*—Kenneth E. Peterson
(74) *Attorney, Agent, or Firm*—Norman N. Kunitz; Fitch, Even, Tabin & Flannery

(57) ABSTRACT

An improved punching tool (1) has a lower tool (3), which is subdivided into a lower tool base plate (7) and a lower-tool operative part (8). The lower tool base plate (7) has a receiving face, with which uniform base areas of a plurality of lower-tool operative parts (8) are associated. The dividing place between the lower-tool operative part (8) and the lower tool base plate (9) is disposed such that all the workpiece-specific designs are present exclusively on the lower-tool operative part (8), while the lower tool base plate (7) is the same, without change, for all workpieces to be machined.

11 Claims, 3 Drawing Sheets

PUNCHING TOOL WITH RE-USABLE, NEUTRAL STRUCTURAL GROUPS

CROSS REFERENCE TO RELATED APPLICATIONS

This application is related to concurrently filed U.S. patent application Ser. No. 10/753,874, corresponding to German Patent application Number DE 103 00 831.4, filed Jan. 10, 2003, the subject matter of which is incorporated herein by reference.

This application claims the priority of German Patent Application Number DE 103 00 818.7, filed Jan. 10, 2003, the subject matter of which is incorporated herein by reference.

BACKGROUND OF THE INVENTION

The invention relates to a punching tool, in particular for green sheets.

It is often necessary, in still-unfired sheetlike ceramic substrates (green sheets), to punch holes in a certain pattern for one or more components or through-contacting means, before the substrate is further processed, for instance into supports for electronic components and conductor tracks. For that purpose, the punching tool has an upper tool that is provided with dies and a lower tool that has a cutting plate. The cutting plate has a flat top side, in which the holes to be punched are located at the intended points. With this arrangement, it is possible to produce components with a punched grid that is replicable. Depending on the feeding of the green sheet, it is possible with one and the same tool to create different punched patterns or components. Below the cutting plate, there is an air distributor plate and a vacuum plate, which mechanically support the cutting plate and supply the required media. For instance, the punched holes of the cutting plate must be subjected to compressed air, in order to blow punching waste (so-called slugs) out of the punched hole. Openings are also provided in the cutting plate and are subjected to compressed air, for guiding the green sheet on an air cushion. The feeding of the green sheet is thus reinforced. The disposition of the openings, like the disposition of the punched openings, is dependent on the pattern to be punched into the green sheet; that is, it is workpiece-specific or component-dependent. Accordingly, the embodiment of the vacuum plate which brings the media to the cutting plate is also workpiece-dependent. The vacuum plate is in turn supported by a lower tool base plate. The lower tool base plate is adapted to the workpiece-specific vacuum plate.

If a machine is to be converted from one workpiece or component (green sheet) to another workpiece, with a different punching grid, then the entire punching tool is replaced. If a component with a new punching grid is to be punched, then the entire tool is constructed from scratch.

SUMMARY OF THE INVENTION

It is the object of the invention to be provide simplification in this respect.

This object is attained by the punching tool of the invention, in which the lower tool is subdivided into a workpiece-nonspecific or component-nonspecific lower tool base plate and a workpiece-specific lower-tool operative part. For adaptation to different workpieces, only the lower-tool operative part has to be replaced. The lower tool base plate is workpiece-nonspecific. Thus a workpiece-nonspecific dividing point or interface is created between the lower-tool operative part and the lower tool base plate. This makes it possible to replace only the lower-tool operative part and optionally to convert or adjust the upper-tool operative part, if a change is to be made from one workpiece to another; large portions of the punching tool, namely the lower tool base plate and the upper tool base plate, continue to be used without change.

The lower tool base plate is disposed for instance on the table of a press, and between the press table and the lower tool base plate, a workpiece-nonspecific dividing point is in turn provided. Because of the additional provision of a further (second) workpiece-nonspecific or component-nonspecific dividing point for the lower tool, however, it is possible to reduce the engineering effort and expense that would otherwise be required for producing a series of different workpieces. It is no longer necessary to keep a different punching tool in stock for every type of component. It is enough to keep corresponding lower-tool operative parts and optionally upper-tool operative parts in stock.

One substantial advantage is that only one each of intrinsically expensive but nonspecific functional elements, such as the linear guide device that guides the upper tool base plate precisely relative to the lower tool base plate, has to be kept in stock. In the final analysis, this is achieved by providing that in both the upper tool and the lower tool of the punching tool, a workpiece-nonspecific interface is introduced between an operative part and the respective associated base plate.

The interface is preferably formed by a plane face that protrudes laterally past the lower-tool operative part and is embodied as a receiving face. As a result, lower-tool operative parts of different size can be secured to the base plate. The base plate then spans the distance between the two laterally disposed linear guide devices and furthermore establishes the connection with the press table of a press that actuates the tool.

Except for the lower-tool operative part, the punching tool can be produced independently of the specific workpiece that is to be punched. This simplifies construction and production considerably. It is also possible, if the punching tool is workpiece-nonspecific, to keep the punching tool in stock to a certain extent, which reduces the overall production times considerably.

The vacuum plate is among the workpiece-specific components. On its top side, it preferably has supporting cross members for the air distributor plate and the cutting plate located above it. Between the supporting cross members, there are passages provided for punching waste; they discharge into a waste funnel embodied in the vacuum plate. The vacuum plate also includes media conduits for vacuum and for compressed air. The vacuum plate is received by its underside by the lower tool base plate. The interface thus embodied is a workpiece-nonspecific interface. On the bottom side, all the vacuum plates for various workpieces look essentially the same.

On the top, the vacuum plate is workpiece-specific; that is, it is adapted to the particular air distributor plate and cutting plate located above it. The adaptation can be made in terms of the size of the vacuum plate, the number and position of supporting cross members, the number and position of upward-pointing openings for vacuum or compressed air, and/or the embodiment of the waste funnel.

Advantageous details of embodiments of the invention will become apparent from the drawing, the associated description, or dependent claims.

BRIEF DESCRIPTION OF THE DRAWINGS

In the drawing, one exemplary embodiment of the invention is illustrated. Shown are.

DETAILED DESCRIPTION OF THE INVENTION

Figure 1:
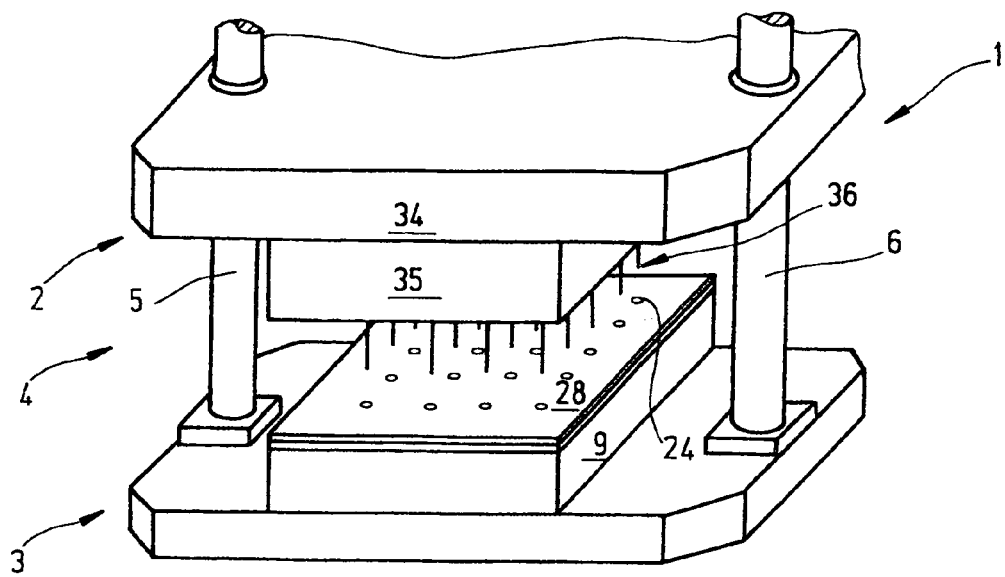
FIG. 1, the punching tool in a schematic, perspective view.

In FIG. 1, a punching tool 1 is shown that includes an upper tool 2 and a lower tool 3. The punching tool is intended for installation in a press, not otherwise shown, that supports the lower tool 3 resting on a press table, while the upper tool 2 can be moved up and down. The upper tool 2 is supported precisely by a linear guide device 4, which includes at least two linear guides 5, 6. The linear guides 5, 6 are formed for instance each by one vertical pillar supported rigidly on the lower tool 3, and guide bushes in the upper tool 2 are associated with these pillars. The pillars are disposed parallel to one another and along the direction of motion of the upper tool 2.

Figure 2:
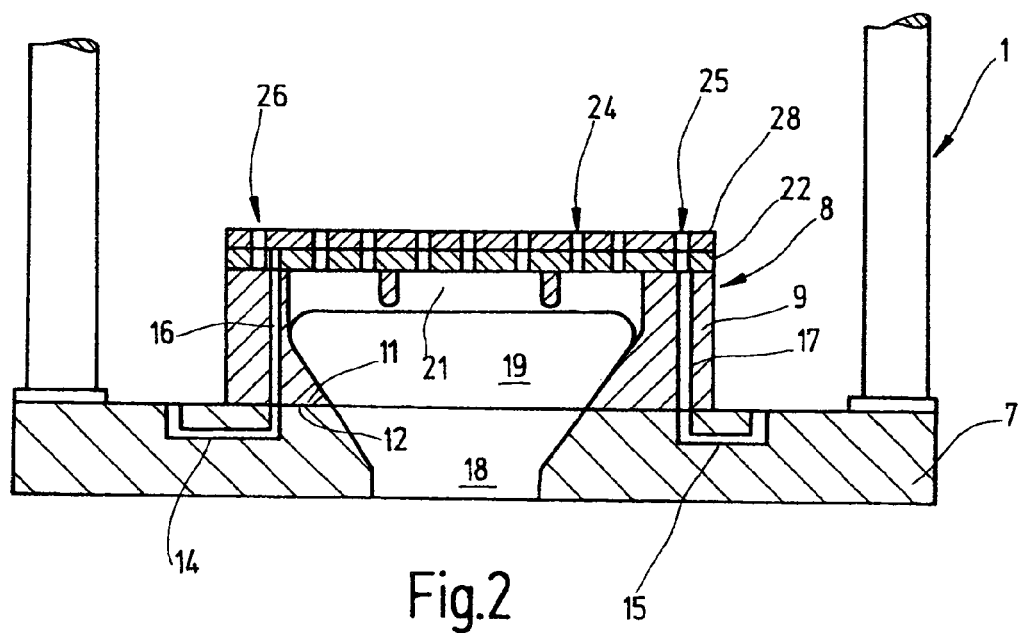
FIG. 2, the punching tool of FIG. 1, in a simplified sectional view.
Figure 3:
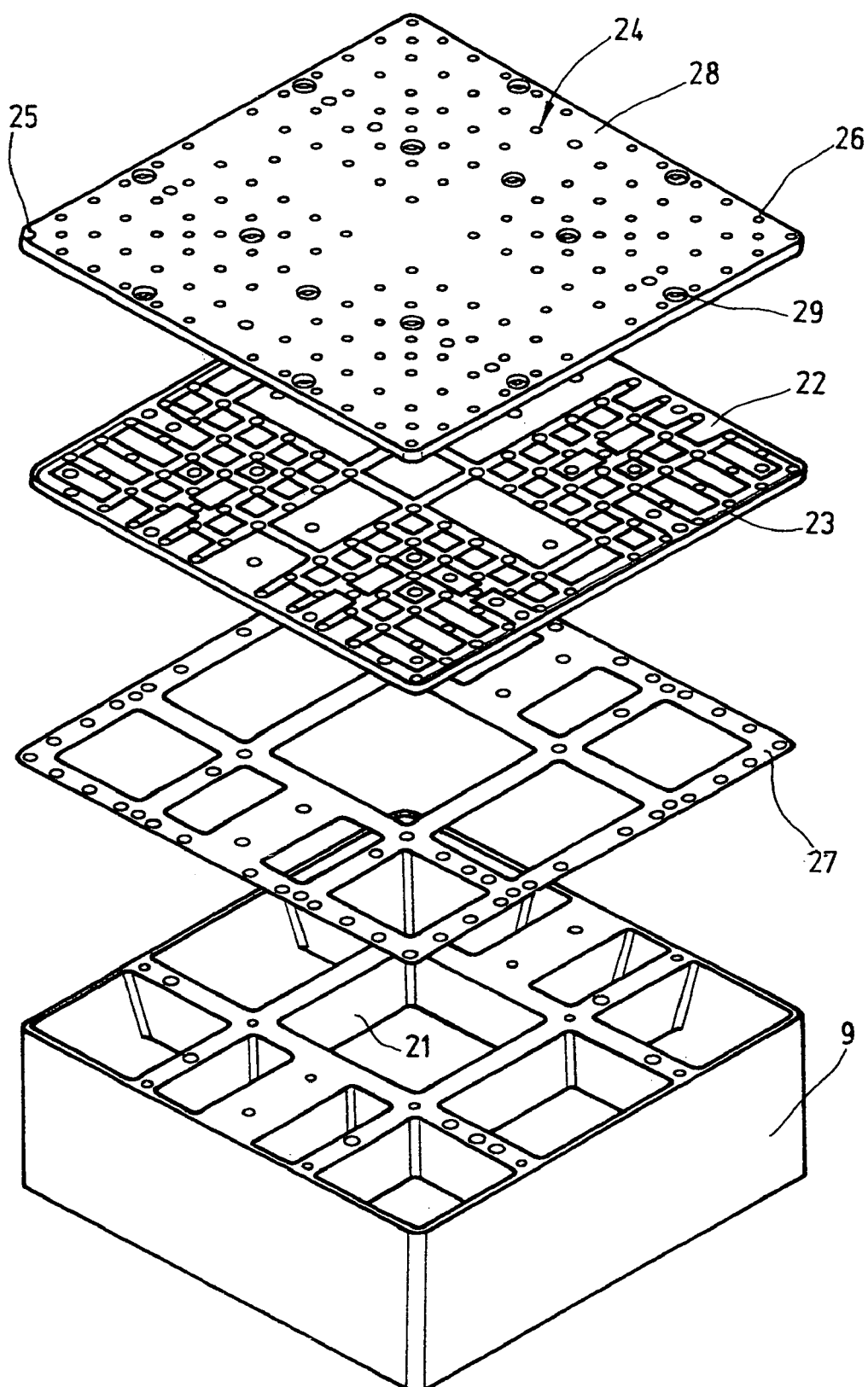
FIG. 3, the workpiece-specific parts of the lower tool of the punching tool, in a perspective exploded view.
Figure 4:
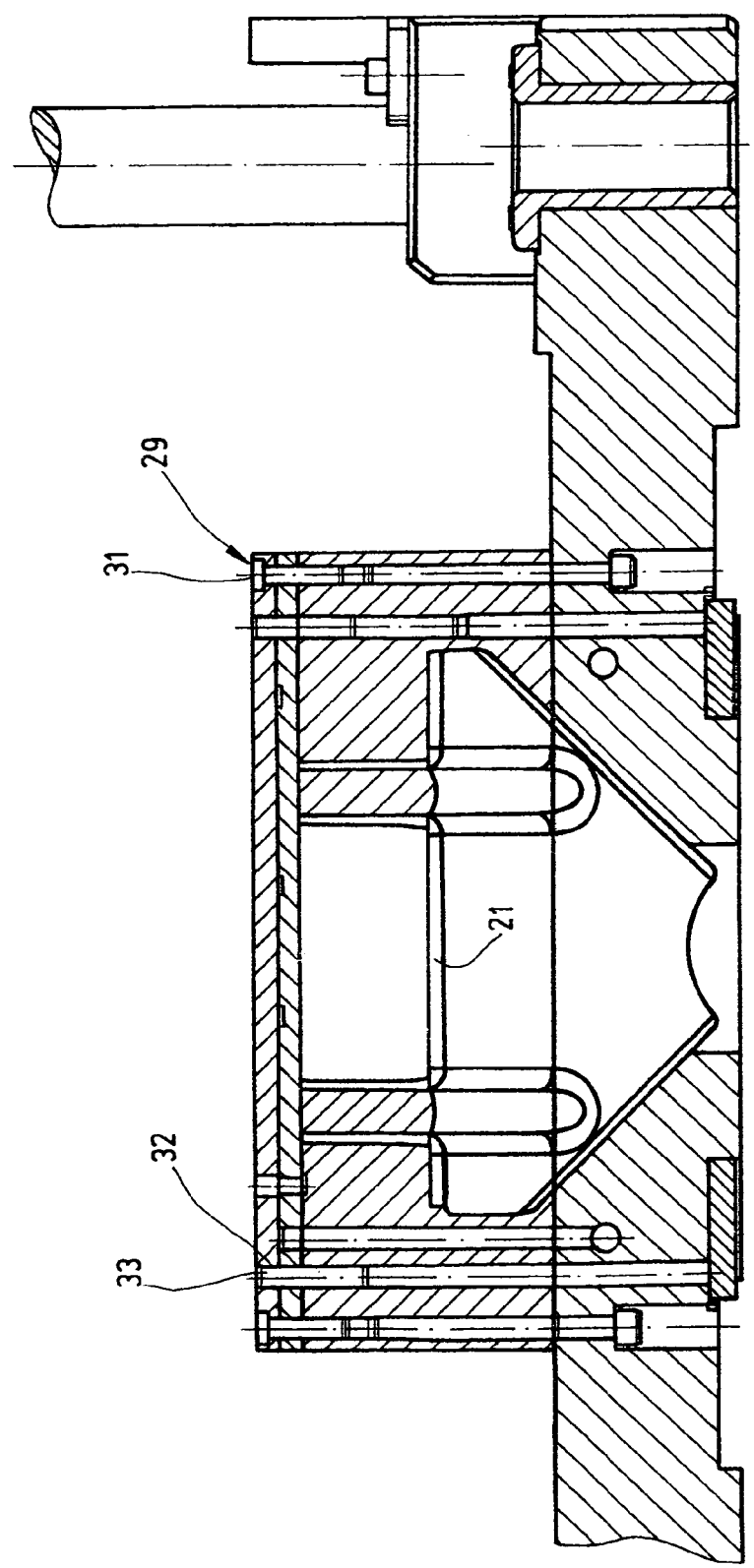
FIG. 4, a sectional view of the lower tool of the punching tool of FIG. 2, on a different scale and showing additional details.

The lower tool 3 includes a lower tool base plate 7, on which a lower-tool operative part 8 is supported. While the lower tool base plate 7 is entirely workpiece-nonspecific, the lower-tool operative part 8 is embodied workpiece-specifically. As FIGS. 2 and 4 show, it includes a vacuum plate 9, which is seated with its flat underside 11 on the top side of the lower tool base plate 7, which is embodied as a flat receiving face 12. It extends over the entire top side of the lower tool base plate 7, or in other words at least over the entire region enclosed between the linear guides 5, 6. The receiving face 12 serves as one uniform interface for all conceivable lower-tool operative parts and thus forms the boundary toward the lower tool for the pattern-dependent parts of the punching tool 1. conduits 14, 15 are embodied in the lower tool base plate 7 and serve to supply the lower-tool operative part 8 with media, such as compressed air. Both the conduit 14 and the conduit 15 are compressed air conduits. Transition openings are embodied on the top side of the lower tool base plate 7 and communicate with inlet openings of a compressed air supply conduit 16, 17 embodied in the vacuum plate 9. A passage 18 to which a vacuum is applied for better removing the punching waste is also embodied in the lower tool base plate 7. The vacuum plate 9 encloses an interior 19, which is surrounded by walls on the sides. The compressed air supply conduits 16, 17 preferably extend perpendicularly through these walls as far as the top side of the vacuum plate 9, branching multiple times and therefore discharging at multiple points. A plurality of cross members 21 are embodied on the top side of the vacuum plate 9 and can be seen particularly from FIGS. 2 and 3. On the top side of the vacuum plate 9, the cross members 21 form a grid, whose passages extend into the interior 19. The disposition of the cross members 21 depends on the disposition of the punched holes to be made in the workpiece. As FIG. 3 shows, the cross members 21 and the edge of the vacuum plate 9 at the top form a plane face, in which the orifices of the compressed air supply conduit 16, 17 are disposed. The vacuum plate 9 is thus workpiece-nonspecific on its underside and workpiece-specific or component-specific, or in other words pattern-dependent, on its top side.

Associated with the vacuum plate 9 is an air distributor plate 22, which has compressed air conduits 23 on its top side. These conduits are embodied as flat grooves, which lead to punched openings 24. The air distributor plate 22 can also have through openings 25, 26 for compressed air, which communicate with the supply conduit 17. For sealing purposes, an intermediate-layer plate 27 can be provided between the air distributor plate 22 and the vacuum plate 9, as can be seen from FIG. 3. The intermediate-layer plate 27 acts as a seal and is provided with holes and openings to match the air distributor plate 22 and the vacuum plate 9. The lower-tool operative part 8 includes, besides the vacuum plate 9, air distributor plate 22 and intermediate-layer plate 27, a cutting plate 28 as well, whose outline matches that of the air distributor plate 22. The punched openings 24, through openings 25, 26 and mounting openings 29 are embodied in the cutting plate 28, and the mounting openings, as shown in FIG. 4, serve to receive fastening screws 31. Further openings 32 (FIG. 4) serve for instance to receive dowels 33, for calibrating and aligning the cutting plate 28.

The upper tool 2, as FIG. 1 shows, includes an upper tool base plate 34, which supports an upper-tool operative part 35. The latter is provided with a plurality of dies 36 extending parallel to one another, each aligned with a respective punched opening 24. The dies 36 are embodied interchangeably and/or adjustably.

The punching tool 1 described thus far functions as follows:

In operation, a green sheet is placed on an air cushion, which is generated by compressed air via the supply conduit 17, on the cutting plate 28. Before the actual punching operation, the upper tool 2 is first moved downward. This creates a defined spacing between the cutting plate 28 and the upper-tool operative part. In the ensuing punching operation, the dies 36 pierce the green sheet and each die punches out one cylindrical slug. The slug is pushed into the punched openings 24. The penetration depth of the dies 36 is at least great enough that the compressed air, supplied to the respective punched opening 24 via the compressed air conduits 23, brings about the removal of the slug from the face end of the die. The slugs therefore move downward to enter the interior 19 and are removed via the passage 18.

The punching operation is repeated continuously, as described above. First, the green sheet is for instance offset by one grid or a new green sheet is inserted. (The term "grid" is understood here to mean a matrixlike spacing of the hole pattern.)

If the punching tool 1 is to be set up for a different component-dependent pattern that has a different hole pattern which cannot be achieved with the cutting plate 28, then the tool 1 is converted. This is done by replacing the lower-tool operative part 8 and correspondingly adjusting the dies 36 and/or replacing the upper-tool operative part 35. The other parts of the punching tool 1 remain unchanged.

If punching tools are to be kept in stock for a plurality of different types of component, then only the corresponding upper tool and lower-tool operative parts have to be kept in stock in component-specific form. The other parts of the punching tool 1 can remain the same, without change.

An improved punching tool 1 has a lower tool 3, which is subdivided into a lower tool base plate 7 and a lower-tool operative part 8. The lower tool base plate 7 has a receiving face, with which uniform base areas of a plurality of lower-tool operative parts 8 are associated. The dividing place between the lower-tool operative part 8 and the lower tool base plate 9 is disposed such that all the workpiece-specific designs are present exclusively on the lower-tool operative part 8, while the lower tool base plate 7 is the same, without change, for all workpieces to be machined.

LIST OF REFERENCE NUMERALS

1 Punching tool
 2 Upper tool
 3 Lower tool
 4 Linear guide device
 5, 6 Linear guide
 7 Lower tool base plate
 8 Lower-tool operative part
 9 Vacuum plate
 11 Underside
 12 Receiving face
 14, 15 Conduits
 16 Compressed air supply conduit
 17 Vacuum supply conduit
 18 Passage
 19 Interior
 21 Cross-members
 22 Air distributor plate
 23 Compressed air conduits
 24 Punched openings
 25, 26 Through openings
 27 Intermediate-layer plate
 28 Cutting plate
 29 Mounting openings
 31 Fastening screws
 32 Openings
 33 Dowels
 34 Upper tool base plate
 35 Operative part of upper tool
 36 Die

The invention claimed is:

1. A punching tool for green sheets, comprising
a lower tool base plate, which is arranged to be supported resting on the table of a punching machine and which is embodied workpiece-nonspecifically,
a lower-tool operative part, which is embodied workpiece-specifically, detachably mounted on an upper surface of said lower tool base plate,
a linear guide device, which is supported by the lower tool base plate,
an upper tool base plate, which is supported movably toward and away from the lower tool base plate by the linear guide device and is embodied workpiece-nonspecifically, and
an upper-tool operative part, which is mounted on the upper tool base plate and is embodied workpiece-specifically or is adaptable to different workpieces; and wherein:
said lower tool operative part includes a plurality of plates including a lower vacuum plate, having a bottom surface that rests on said upper surface of said lower tool base plate, an air distributor plate, an intermediate plate, and an upper cutting plate containing openings for receiving punching dies on the upper tool operative part during a punching operation;
said lower tool operative part further includes vacuum conduits, which extend through at least said vacuum plate to secure a green sheet in place during a punching operation, and compressed air supply conduits disposed in said vacuum plate; and,
said vacuum plate has walls that define a substantially hollow interior space for receiving slugs punched from a green sheet during a punching operation, with the interior space being in direct communication with an underlying opening in the lower tool base plate in order to remove slugs from the lower tool operative part.

2. The punching tool of claim 1, wherein the lower tool base plate has a flat top side, which extends laterally past the lower-tool operative part and is embodied as a receiving face for the lower-tool operative part.

3. The punching tool of claim 1, wherein said lower surface of the vacuum plate contacts said upper surface of the lower tool base plate.

4. The punching tool of claim 1, wherein the vacuum supply conduits and the compressed air supply conduits communicate with conduits that are provided in the lower tool base plate.

5. The punching tool of claim 1, wherein the interior space is funnel shaped.

6. The punching tool of claim 1 wherein the course of the compressed air supply conduits and of the vacuum supply conduits is workpiece-specific or dependent on a punching pattern.

7. A punching tool for green sheets, comprising:
a lower tool base plate, which is arranged to be supported resting on the table of a punching machine and which is embodied workpiece-nonspecifically;
a lower-tool operative part, which is embodied workpiece-specifically, detachably mounted on an upper surface of said lower tool base plate;
a linear guide device, which is supported by the lower tool base plate,
an upper tool base plate, which is supported movably toward and away from the lower tool base plate by the linear guide device and is embodied workpiece-nonspecifically; and
an upper-tool operative part, which is mounted on the upper tool base plate and is embodied workpiece-specifically or is adaptable to different workpieces; and wherein:
said lower tool operative part includes a plurality of plates including a lower vacuum plate, having a bottom surface that rests on said upper surface of said lower tool base plate, an air distributor plate, an intermediate plate, and an upper cutting plate containing openings for receiving punching dies on the upper tool operative part during a punching operation;
said lower tool operative part further includes vacuum conduits, which extend through at least said vacuum plate to secure a green sheet in place during a punching operation,
said vacuum plate has walls that define a substantially hollow interior space for receiving slugs punched from a green sheet during a punching operation, with the interior space being in direct communication with an underlying opening in the lower tool base plate in order to remove slugs from the lower tool operative part; and,
the vacuum plate, on its top side, has cross members for bracing the air distributor plate and for sealing off compressed air conduits that are embodied on the top side thereof.

8. The punching tool of claim 7, wherein the vacuum plate includes compressed air supply conduits and said vacuum supply conduits.

9. A punching tool for green sheets, comprising
a lower tool base plate, which is arranged to be supported resting on the table of a punching machine and which is embodied workpiece-nonspecifically,
a lower-tool operative part, which is embodied workpiece-specifically, detachably mounted on an upper surface of said lower tool base plate,
a linear guide device, which is supported by the lower tool base plate,
an upper tool base plate, which is supported movably toward and away from the lower tool base plate by the linear guide device and is embodied workpiece-nonspecifically, and
an upper-tool operative part, which is mounted on the upper tool base plate and is embodied workpiece-specifically or is adaptable to different workpieces; and wherein:
said lower tool operative part includes a plurality of plates including a lower vacuum plate, having a bottom surface that rests on said upper surface of said lower tool base plate, and an upper cutting plate containing openings for receiving punching dies on the upper tool operative part during a punching operation;
said lower tool operative part further includes vacuum conduits, which extend through at least said vacuum plate to secure a green sheet in place during a punching operation,
said vacuum plate has walls that define a substantially hollow interior space for receiving slugs punched from a green sheet during a punching operation, with the interior space being in direct communication with an underlying opening in the lower tool base plate in order to remove slugs from the lower tool operative part; and,
the lower surface of said vacuum plate contacts said upper surface of the lower tool base plate; the vacuum plate includes compressed air supply conduits and said vacuum supply conduits with said conduits extending to said lower surface of said vacuum plate, and the vacuum supply conduits and the compressed air supply conduits communicate with conduits that are provided in the lower tool base plate and extend to said upper surface of said lower tool base plate beneath said lower tool operative part.

10. The punching tool of claim 9, wherein the lower tool base plate has a flat top side, which extends laterally past the lower-tool operative part and is embodied as a receiving face for the lower-tool operative part.

11. The punching tool of claim 9, wherein the lower-tool operative part has said vacuum plate, an air distributor plate, an intermediate plate, and said cutting plate.

* * * * *